United States Patent
Ha

(10) Patent No.: US 10,797,262 B2
(45) Date of Patent: Oct. 6, 2020

(54) ORGANIC-BASED LIGHTING DEVICE

(71) Applicant: LG Display Co., Ltd., Seoul (KR)

(72) Inventor: Hyunggun Ha, Busan (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/727,316

(22) Filed: Dec. 26, 2019

(65) Prior Publication Data

US 2020/0212351 A1 Jul. 2, 2020

(30) Foreign Application Priority Data

Dec. 31, 2018 (KR) .................. 10-2018-0173670

(51) Int. Cl.
  *H01L 51/52* (2006.01)
  *H01L 51/50* (2006.01)

(52) U.S. Cl.
  CPC ........ *H01L 51/5237* (2013.01); *H01L 51/504* (2013.01); *H01L 51/5212* (2013.01)

(58) Field of Classification Search
  None
  See application file for complete search history.

(56) References Cited

U.S. PATENT DOCUMENTS

| | | | |
|---|---|---|---|
| 2017/0200775 A1* | 7/2017 | Kim | H01L 27/3223 |
| 2017/0285390 A1* | 10/2017 | Mun | G02F 1/13394 |
| 2019/0041915 A1* | 2/2019 | Park | H01L 51/0097 |
| 2019/0165076 A1* | 5/2019 | Lee | G09G 3/3266 |

FOREIGN PATENT DOCUMENTS

| | | | |
|---|---|---|---|
| KR | 2001-0084614 A | | 9/2001 |
| KR | 10-2005-0011951 A | | 1/2005 |

* cited by examiner

*Primary Examiner* — Benjamin P Sandvik
(74) *Attorney, Agent, or Firm* — Polsinelli PC

(57) ABSTRACT

An organic light emitting device comprises an array region including a light-emission area and a non-light-emission area; and a bezel region outside the array region, wherein the array region has a structure where a gate line, a first electrode, a passivation film, an organic light-emission layer, and a second electrode are disposed on a substrate, and wherein the bezel region has a structure where the gate line, the first electrode and the passivation film are stacked on the substrate, and the passivation film contacts both the gate line and the first electrode.

18 Claims, 9 Drawing Sheets

FIG. 5
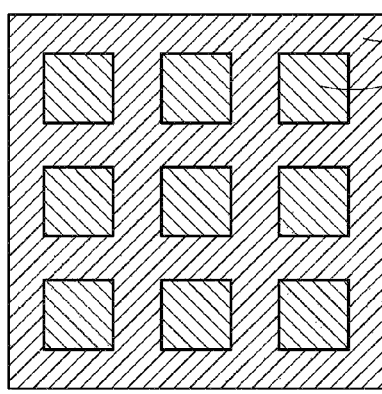
(a)
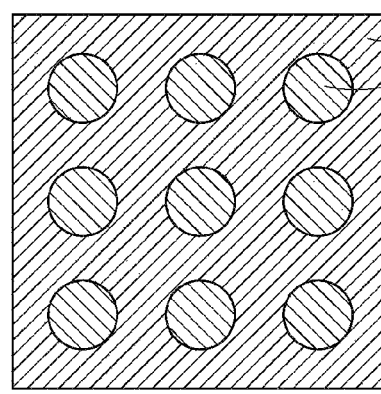
(b)
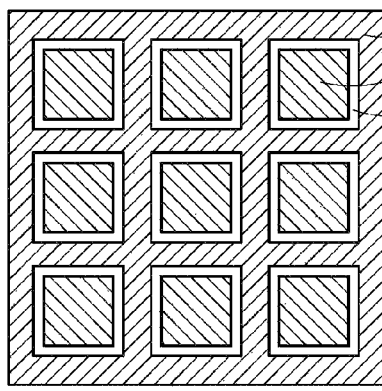
(c)
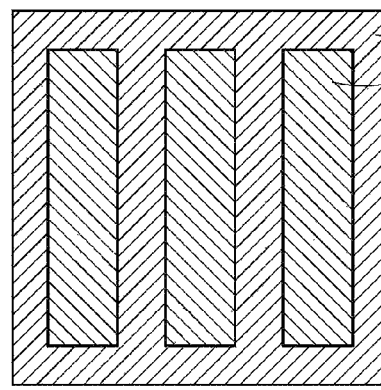
(d)

ORGANIC-BASED LIGHTING DEVICE

CROSS REFERENCE TO RELATED APPLICATION

This application claims the priority of Korean Patent Application No. 10-2018-0173670 filed on Dec. 31, 2018, which is hereby incorporated by reference in its entirety.

BACKGROUND

Field of the Disclosure

The present disclosure relates to an organic light emitting device.

Description of the Background

Fluorescent lamps and incandescent lamps are currently used as lighting devices. However, the incandescent lamps have very low energy efficiency. The fluorescent lamps have low color rendering index and contain mercury, which causes environmental problems Recently, a LED lighting device using a nitride semiconductor-based light emitting diode has been proposed. However, in the LED lighting device, heat dissipation means must be placed on a back face of the lighting device due to heat generated from the light emitting diode.

Further, the light emitting diode may be produced on a rigid substrate such as a sapphire substrate using an epitaxial deposition process. Therefore, unless individual light emitting diode chips are mounted on a flexible substrate, the LED lighting device may not have flexible characteristic.

Many researches have been made on organic-based lighting devices using organic light emitting diodes (LEDs) that overcome limitations of the nitride semiconductor-based LED lighting devices. The organic-based lighting device may achieve a large area. Further, in the organic-based lighting device, an organic-based light emitting diode may be formed in a low cost glass substrate or a plastic substrate. Further, since the organic light emitting diode may be formed on the plastic substrate, the organic-based lighting device may easily achieve the flexible characteristic.

In an organic-based lighting device, a bezel region outside a light-emission region has a stack of a gate line, a first electrode layer, and a passivation film. In this connection, a peeling-off phenomenon of the passivation film may be problematic. When the peeling-off of the passivation film occurs, moisture or air penetrates into a gap between the passivation film and the underlying first electrode layer. Thus, a short circuit may occur between the first electrode and the second electrode, or the organic light-emission layer may be deteriorated. The peeling-off phenomenon of the passivation film is due to lack of adhesion between the passivation film and a transparent conductive oxide as a material of the first electrode layer.

SUMMARY

Thus, the present disclosure provides an organic-based lighting device in which the peeling-off of the passivation film in the bezel region may be suppressed.

Further, the present disclosure provides an organic-based lighting device in which adhesion of the passivation film in the bezel region may be improved.

The present disclosure is not limited to the above-mentioned purposes. Other aspects and advantages of the present disclosure, as not mentioned above, may be understood from the following descriptions and more clearly understood from the aspects of the present disclosure. Further, it will be readily appreciated that the purposes and advantages of the present disclosure may be realized by features and combinations thereof as disclosed in the claims.

To accomplish the purposes, an organic-based lighting device according to the present disclosure includes an array region and a bezel region outside the array region. In the bezel region, a gate line, a first electrode, and a passivation film are stacked on a substrate. In this connection, in the bezel region, the passivation film contacts with both the gate line and the first electrode.

In accordance with the present disclosure, in the bezel region, the passivation film contacts both the gate line and the first electrode. It is known that adhesion between the passivation film and metal is higher than adhesion between the passivation film and transparent conductive oxide. That is, in accordance with the present disclosure, considering that both the first electrode and the gate line are required in the bezel region and the excellent adhesion between the passivation film and the metal is achieved, the present inventors configures the device such that in the bezel region, the passivation film contacts both the gate line and the first electrode. This may reduce the peeling-off defect of the passivation film in the bezel region.

In one implementation, the gate line is made of a metal material, and the first electrode is made of a transparent conductive oxide material.

In one implementation, in the bezel region, the first electrode has a plurality of holes defined therein exposing the underlying gate line. Thus, the passivation film contacts the gate line through the plurality of holes formed in the first electrode.

In one implementation, in the bezel region, a contact area between the passivation film and a top surface of the gate line is larger than a contact area between the passivation film and a top surface of the first electrode. It is known that adhesion between the passivation film and metal is higher than adhesion between the passivation film and transparent conductive oxide. Thus, considering this fact, the present inventors configure the device such that in the bezel region, a contact area between the passivation film and a top surface of the gate line is larger than a contact area between the passivation film and a top surface of the first electrode.

In one implementation, in the array region, a structure including a gate line, a first electrode, a passivation film, an organic light-emission layer, and a second electrode may be disposed on a substrate. Specifically, the first electrode, the organic light-emission layer, and the second electrode may be stacked in the light-emission area of the array region. In the non-light-emission area of the array region, the gate line, the first electrode, the passivation film, the organic light-emission layer, and the second electrode may be stacked.

To accomplish the purposes, an organic-based lighting device according to the present disclosure includes an array region including light-emission and non-light-emission areas; and a bezel region outside the array region, wherein in a portion of the bezel region, a pad area is present, wherein in the pad area, a first pad and a second pad are disposed, wherein in a region other than the pad area in the bezel region, a gate line, a first electrode, and a passivation film are stacked on the substrate, wherein in the region other than the pad area in the bezel region, the passivation film contacts both the gate line and the first electrode.

As the passivation film contacts both the gate line and the first electrode in the bezel region, adhesion of the passivation film may be increased, thereby reducing the peeling-off defect of the passivation film in the bezel region.

In one implementation, the first pad is connected to the first electrode and the second pad is connected to the second electrode. In the pad area, each of the first pad and the second pad includes a first layer arranged in the same layer as the gate line and a second layer arranged in the same layer as the first electrode.

In one implementation, in the pad area, the second layer has a plurality of holes defined therein exposing the underlying first layer.

In the organic-based lighting device according to the present disclosure, both the first electrode and the gate line are present in the bezel region. Considering the advantage of the excellent adhesion between the passivation film and the metal, in the bezel region, the passivation film contacts both the gate line and the first electrode. This may reduce the peeling-off defect of the passivation film in the bezel region.

In accordance with the present disclosure, in the bezel region, the direct contact between the passivation film and the gate line may be easily realized by forming the plurality of holes in the first electrode through which the gate line is exposed.

Furthermore, in accordance with the present disclosure, the plurality of holes is formed in the first electrode in the bezel region. Thus, the direct contact effect between the passivation film and the gate line may be obtained, and, further, the contact area of the passivation film may be increased.

In addition to the above effects, specific effects of the present disclosure are described below in conjunction with descriptions of specific details to implement the present disclosure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 5 with references (a) to (d), show various types of holes formed in a first electrode in a bezel region;

DETAILED DESCRIPTION

Figure 1:
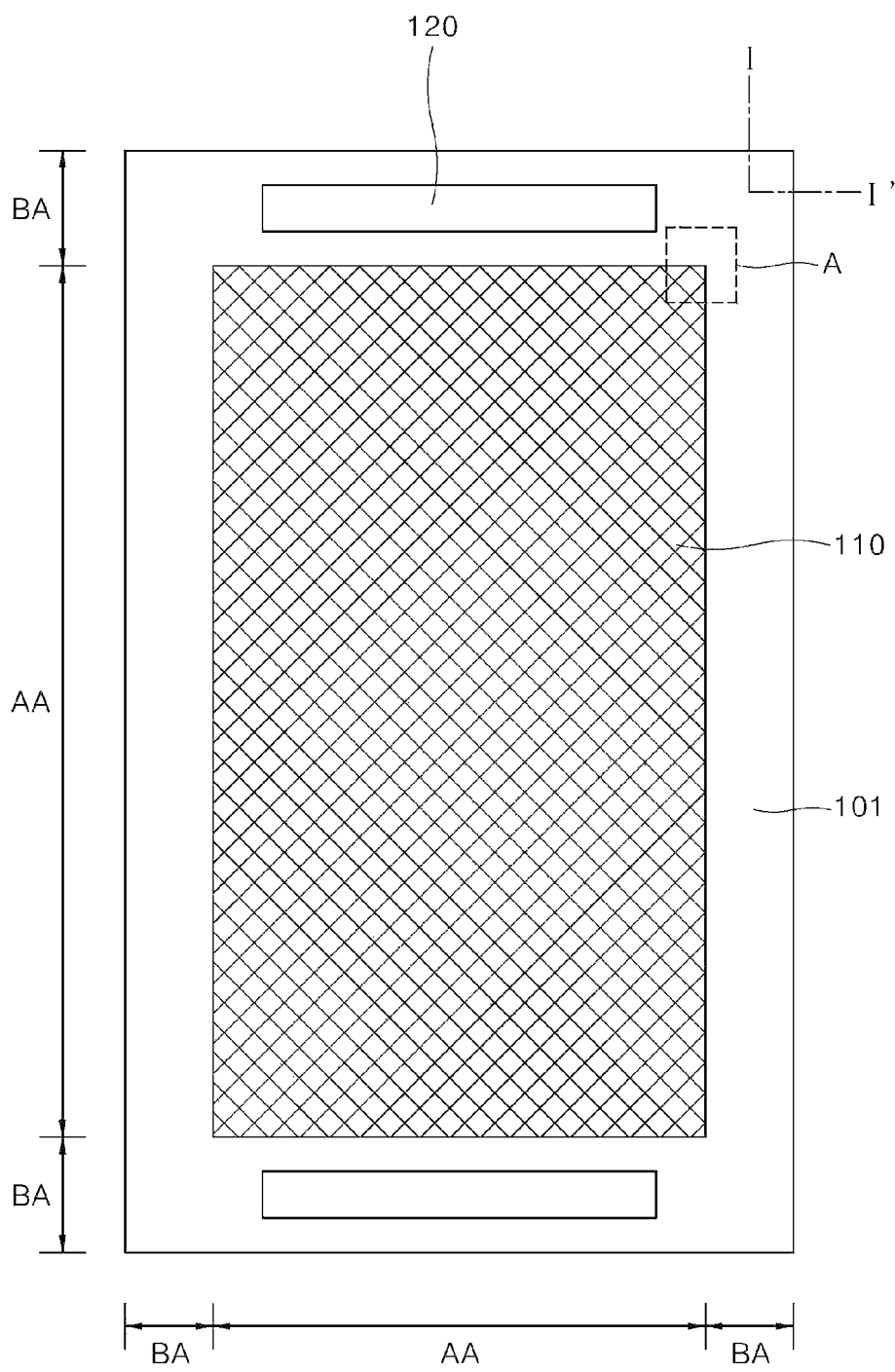
FIG. 1 is a plan view of an organic-based lighting device according to an aspect of the present disclosure.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

The terminology used herein is for the purpose of describing particular aspects only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, organic-based lighting devices according to some aspects of the present disclosure will be described.

Figure 2:
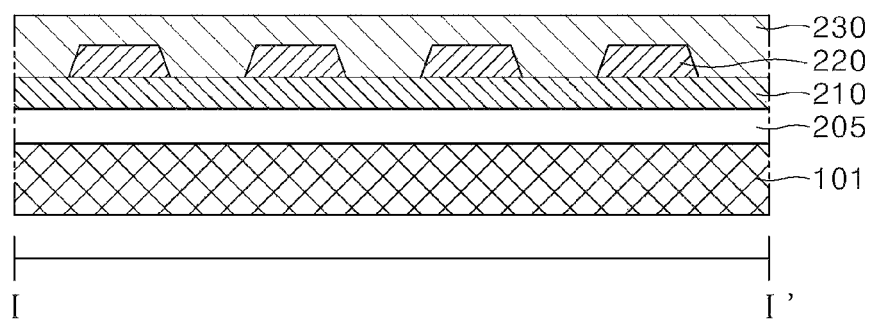
FIG. 2 shows a cross-sectional view along line I-I' in FIG. 1.

FIG. 1 is a plan view of an organic-based lighting device according to an aspect of the present disclosure. FIG. 2 shows a cross-sectional view along line I-I' in FIG. 1.

Referring to FIG. 1, an organic-based lighting device includes an array region AA and a bezel region BA outside the array region.

Figure 7:
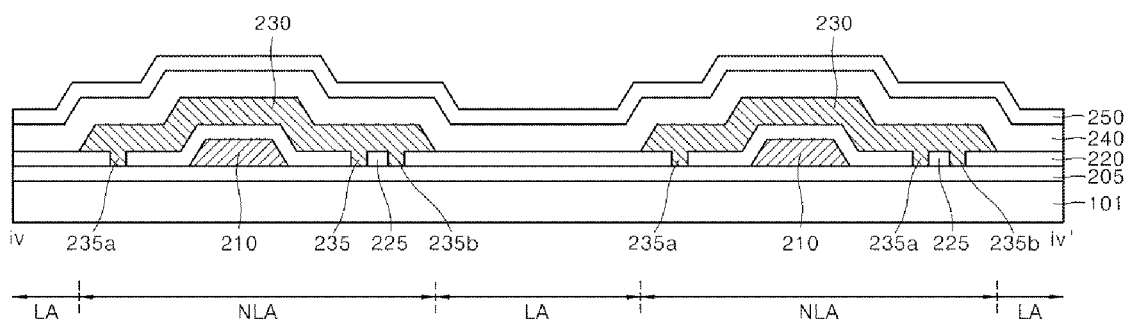
FIG. 7 shows a cross-sectional view along line II-II' in FIG. 6.

The array region AA includes a light-emission section and a non-light-emission section. As shown in FIG. 7, in the array region AA, a structure 110 including a gate line 210, a first electrode 220, a passivation film 230, an organic light-emitting layer 240, and a second electrode 250 is disposed on a substrate 101.

In the organic-based lighting device according to the present disclosure, the substrate 101 may be made of a glass material or a plastic material such as polyimide (PI), polyethylene terephthalate (PET), polypropylene (PP), polycarbonate (PC), and the like. When the substrate 101 is made of the plastic material, the organic-based lighting device may have flexible characteristics. Further, when the substrate 101 is made of a plastic material, the organic lighting device may be continuously manufactured using a roll-to-roll process. On a top face of the substrate 101, an internal light extracting layer such as a micro-lens structure may be additionally disposed for improving light efficiency. Further, a light extracting film may be further adhered to a bottom face of the substrate 101 to improve the light efficiency. Further, a barrier layer 205 may be further disposed on a top face of the substrate 101 to prevent penetration into the substrate of moisture below the substrate. The barrier layer 205 may be formed of a single layer such as a $SiO_2$ or $SiN_x$ layer or of a stack of multiple layers such as $SiN_x/SiO_2/SiN_x$ layers.

In the bezel region BA, the gate line 210, first electrode 220 and passivation film 230 are stacked on the substrate 101, as may be shown in FIG. 2.

In the bezel region BA, the gate line 210 and the first electrode 220 serve to distribute current to respective portions of the array region AA. Accordingly, the gate line 210 may have an integral structure between the array region AA and the bezel region BA. The first electrode 220 may have an integral structure between the array region AA and the bezel region BA.

The passivation film 230 covers the gate line 210 and the first electrode 220 in the bezel region. When the gate line 210 and the first electrode 220 are not covered by the passivation film 230 in the bezel region, decrease in electrical performance due to oxidation may be problematic.

Figure 3:
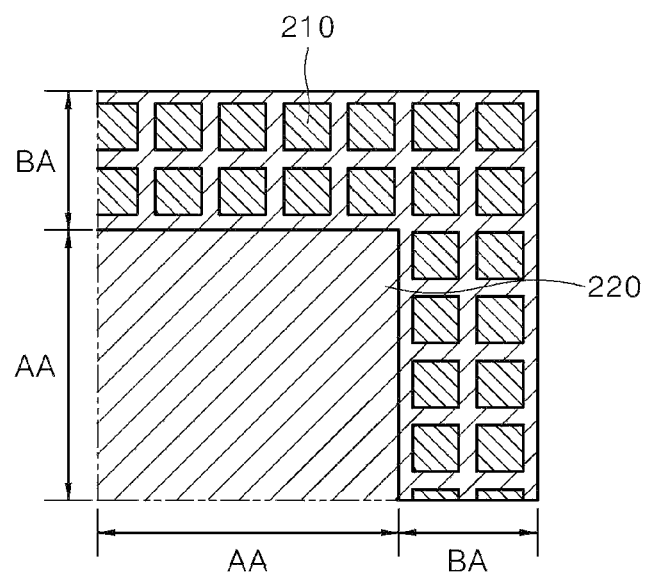
FIG. 3 shows a first electrode structure in portion A of FIG. 1.

Referring to FIG. 2, in accordance with the present disclosure, the passivation film 230 is in contact with the gate line 210 and the first electrode 220 in the bezel region BA. To this end, the first electrode 220 may be placed in an entirety of the array region AA, as in the example shown in FIG. 3. In the bezel region BA, the first electrode 230 may be arranged in a grid form. When the first electrode 220 is arranged in a grid form in the bezel region BA, the gate line 210 is exposed in a region where the first electrode 220 is not formed.

As described above, in the bezel region BA, the first electrode 220 and the gate line 210 serve to distribute the current to the respective portions of the array region AA. Further, when the first electrode 220 is not present in the bezel region BA, arcing due to plasma biasing may occur in a process involving plasma. Further, the gate line 210 serves to conceal the overlying layers when the organic-based lighting device is of a bottom emission type. When there is no gate line 210 in the bezel region BA, interfaces between the organic light-emission layer 240, the second electrode 250, and the encapsulating layer 260 which are disposed above the gate line may be visually recognized. For these reasons, the first electrode 220 and the gate line 210 should not be removed in the bezel region BA.

Referring to FIG. 2, in accordance with the present disclosure, the passivation film 230 is contacted with both the gate line 210 and the first electrode 220 in the bezel region BA. Adhesion between the passivation film made of, for example, SiN and metal is higher than adhesion between the passivation film and a transparent conductive oxide.

That is, in accordance with the present disclosure, considering that both the first electrode 220 and the gate line 210 are needed in the bezel region BA, and that the adhesion between the passivation film 230 and the metal is excellent, the passivation film 230 is in contact with both the gate line 210 and the first electrode 220 in the bezel region BA. The passivation film 230 directly contacts the gate line 210 in the bezel region. Thus, in this configuration, the adhesion may be higher than that in a configuration that the passivation film 230 contacts only the first electrode. This may reduce the peeling-off of the passivation film.

The gate line 210 may be made of a metal material. The first electrode 220 may be made of a transparent conductive oxide material.

The direct contact between the passivation film 230 and the gate line 210 in the bezel region BA in accordance the present disclosure may be easily realized by forming a plurality of holes in the first electrode 220 through which the underlying gate line 210 is exposed. That is, in the bezel region BA, in the first electrode 220, the plurality of holes may be defined through which the underlying gate line 210 is exposed, such that the passivation film 230 is in contact with the gate line 210 through the plurality of holes formed in the first electrode 220.

The plurality of holes may be formed in the first electrode 220 in the bezel region BA to thereby obtain the direct contact between the passivation film 230 and the gate line 210, thereby to increase the contact area of the passivation film 230.

Figure 4:
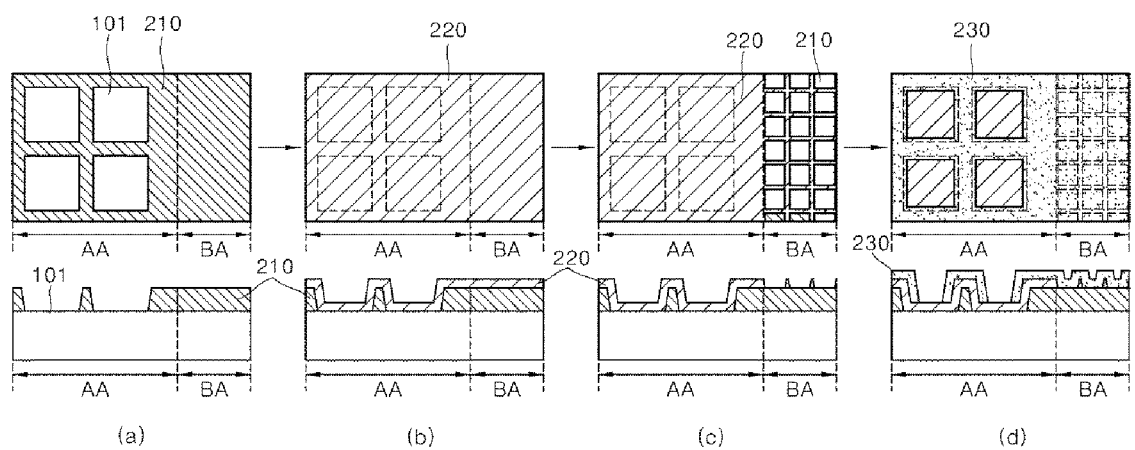
FIG. 4 with references (a) to (d), show a plan view and a cross-sectional view showing a stacking process of a gate line, a first electrode, and a passivation film in an array and bezel regions.

FIG. 4 with references (a) to (d) show a plan view and a cross-sectional view of a stacking process of the gate line, the first electrode, and the passivation film in the array and bezel regions.

Referring to FIG. 4 at reference (a), the gate line 210 is placed on the substrate in the bezel region. The gate line 210 may be formed into a grid pattern via etching thereof in the array region AA. In the bezel region BA, the gate line 210 may not be etched. Then, the first electrode 220 is disposed on the gate line 210 as shown in FIG. 4 at reference (b). In this step, the first electrode 220 may be formed entirely in the array region AA and the bezel region BA.

Then, the gate line 210 is exposed by forming the holes penetrating the first electrode 220 using dry etching, wet etching, laser cutting, etc., as shown in FIG. 4 at reference (c). In this way, the first electrode 220 is not etched in in the array region AA, while in the bezel region BA, the first electrode is formed into a grid pattern via etching thereof. However, as described later with reference to FIG. 6 and FIG. 7, the first electrode 220 may be partially etched to form a current injection line 225 in the array region AA.

The grid pattern of the first electrode 220 formed in the bezel region BA may be formed to be denser and smaller than the grid pattern of the gate line 210 formed in the array region AA.

Then, a passivation material such as SiN may be deposited to form the passivation film 230 on the gate line 210 in the array region AA and on the first electrode 220 and on an exposed portion of the gate line 210 in the bezel region BA, as shown in FIG. 4 at reference (d). In the bezel region, the passivation film 230 contacts both the gate line 210 and first electrode. The passivation film 230 contacts only the first electrode 220 in the array region and contacts the substrate 101 in a region where the first electrode 220 is partially etched to form the current injection line 225.

In one example, an area of the passivation film 230 contacting the top surface of the gate line 210 may be larger than an area of the passivation film 230 contacting the top surface of the first electrode 220 in the bezel region BA.

For example, in the bezel region BA, when the area percentage of the passivation film 230 contacting the gate line 210 and the first electrode 220 is assumed to be 100%, the area where the passivation film 230 contacts the top surface of the first electrode 220 is about 30% and an area where the passivation film 230 contacts the top surface of the gate line 210 is about 70%.

When considering the greater adhesion between the passivation material and the metal than the adhesion between the passivation material and the transparent conductive oxide, it is desirable to enable the contact area between the passivation film 230 and the top surface of the gate line 210 to be larger than the contact area between the passivation film 230 and the top surface of the first electrode 220.

FIGS. 5(a) to 5(d) show various types of holes formed in the first electrode in the bezel region.

Each of the holes formed in the first electrode 220 in the bezel region BA may have a quadrangular shape in a plan view as shown in FIG. 5 at reference (a) or may have a circular shape in a plan view as shown in FIG. 5 at reference (b).

Furthermore, the hole formed in the first electrode 220 in the bezel region BA may have a shape having a step 222 in a plan view as shown in FIG. 5 at reference (c). The step 222 may be formed by partial-etching and remaining a portion of the first electrode 220 in a thickness direction thereof. In this case, the step 222 has a positive pattern.

In another example, the step 222 may be formed by etching an entirety of the first electrode 220 in the thickness direction, and then by partially etching the gate line 210. In this case, the step 222 has a negative pattern. The contact area between the passivation film 230 and the gate line 210 when the step 222 has the negative pattern may be larger than the contact area between the passivation film 230 and the gate line 210 when the step 222 has the positive pattern.

The hole formed in the first electrode 220 of the bezel region BA may have a dot type as in the examples shown in FIGS. 5(a) to 5(c). In another example, the hole may have a line type as in the example shown in FIG. 5 at reference (d).

The shape of the hole formed in the first electrode 220 in the bezel region BA in accordance with the present disclosure is not limited to the examples shown in FIG. 5. The shape of the hole formed in the first electrode 220 in the bezel region BA in accordance with the present disclosure may have any shape as long as the top surface of the underlying gate line 210 is exposed through the shape of the hole.

Figure 6:
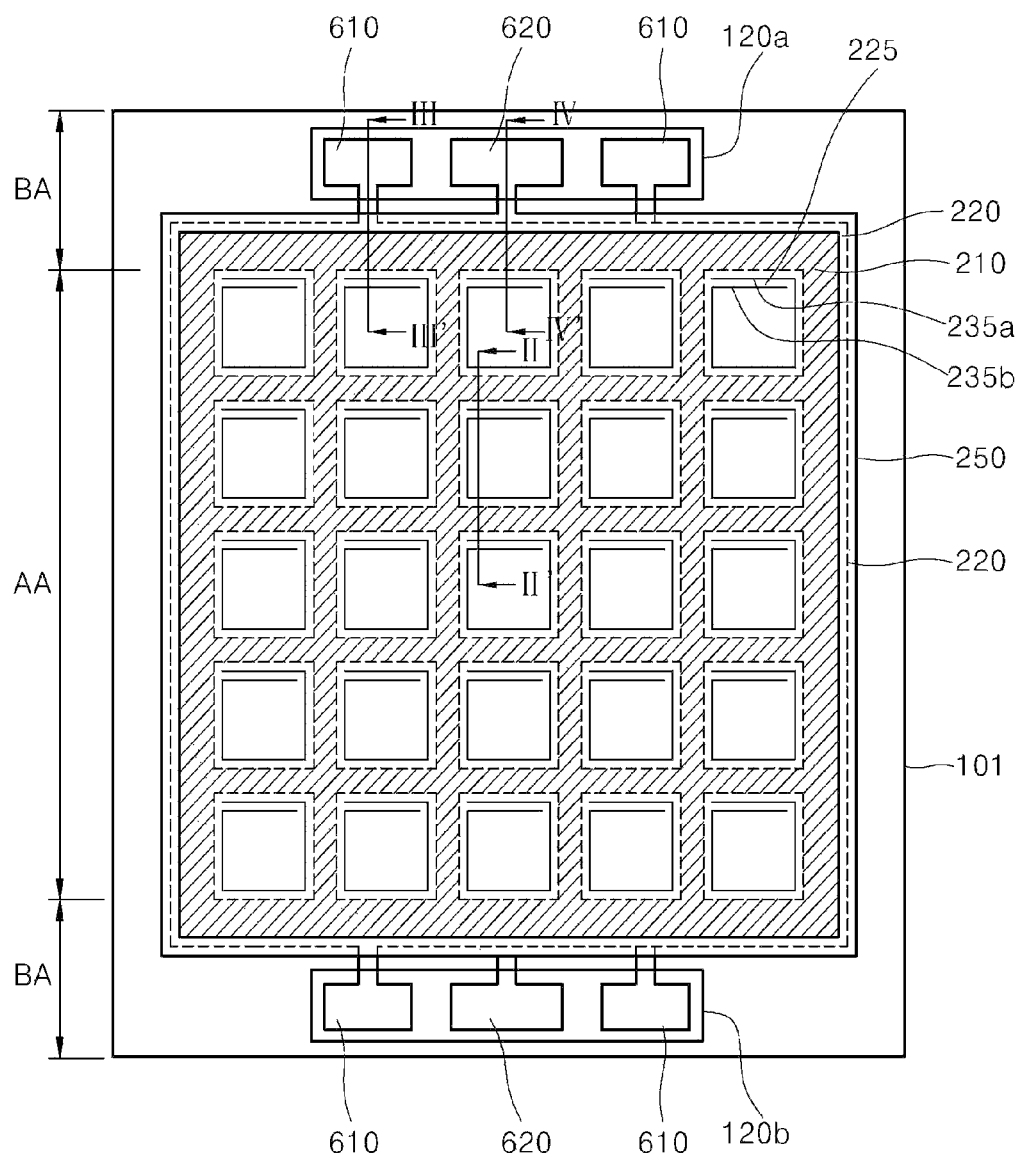
FIG. 6 is a plan view of an organic-based lighting device according to an aspect of the present disclosure.

FIG. 6 is a plan view of an organic-based lighting device according to an aspect of the present disclosure. FIG. 7 shows a cross-sectional view along line II-IT in FIG. 6.

The array region AA includes a light-emission area LA and a non-light-emission area NLA. The light-emission area LA is defined by the gate line 210 and the passivation film 230.

In the light-emission area of the array region AA, a first electrode 220, an organic light-emitting layer 240 and a second electrode 250 are stacked on the substrate 101. A barrier layer 205 made of $SiO_2$, $SiN_x$, or the like may be disposed between the substrate 101 and the first electrode 220.

On the other hand, in the non-light-emission area of the array region AA, the gate line 210, the first electrode 220, the passivation film 230, the organic light-emitting layer 240 and the second electrode 250 are stacked on the substrate 101. In the light-emission area, the stack of the first electrode 220, the organic light-emitting layer 240, and the second electrode 250 emits light when current is supplied thereto. In the non-light-emission area, light emission may not occur even when current is supplied to the stack of the first electrode 220, the passivation film 230, the organic light-emission layer 240 and the second electrode 250.

The first electrode 220 may be made of a transparent conductive oxide material such as ITO (Indium Tin Oxide), FTO (Fluorine-doped Tin Oxide), or the like. The passivation film 230 may be made of an organic material such as a polyimide-based material, or an inorganic material such as alumina ($Al_2O_3$), silicon nitride ($SiN_x$), or the like.

The organic light-emitting layer 240 may contain CuPc (copper phthalocyanine), NPB (N,N-di(naphthalene-1-yl)-N,N'-diphenyl benzidine), Alq3 (tris-8-hydroxyquinoline aluminum) or various other known organic light-emission materials. The organic light-emitting layer 240 may include an electron injection layer, an electron transport layer, a light-emission layer, a hole transport layer, and a hole injection layer.

In this connection, an organic light-emission layer having a tandem structure including a stack of two or more light-emission layers may be used. The at least two light-emission layers may be directly stacked. Alternatively, an intermediate layer such as a hole transport layer or an electron transport layer may be disposed between the two or more light-emission layers. Examples of the tandem structure may include a structure in which a blue light-emission layer, a green light-emission layer, and a red light-emission layer are sequentially stacked, a structure in which a blue light-emission layer, and a red light-emission layer are sequentially stacked, a structure in which a blue light-emission layer, a yellow/green light-emission layer and a blue light-emission layer are sequentially stacked, a structure in which a red/green light-emission layer, a blue light-emission layer, and a red/green light-emission layer are sequentially stacked.

The second electrode 250 may be made of a material such as aluminum (Al) and silver (Ag). Alternatively, a transparent conductive oxide material such as ITO may be used for the second electrode 250.

For example, when the first electrode 220 acts as an anode and the second electrode 250 acts as a cathode, electrons are injected from the second electrode 250 into the organic light-emitting layer 240, while holes are injected from the first electrode 220 into the organic light-emitting layer 240. As the electrons and holes are injected into the organic light-emitting layer 240, excitons may be generated in the organic light-emitting layer 240. Then, as the exciton is decayed, light corresponding to an energy difference between the LUMO (Lowest Unoccupied Molecular Orbital) of the organic light-emission layer 240 and the HOMO (Highest Occupied Molecular Orbital) thereof is emitted.

The first electrode 220 under the organic light-emitting layer 240 may be made of a transparent conductive oxide material for light-emission in the downward direction from the substrate 101. However, the transparent conductive oxide such as ITO has a relatively high resistance as compared with metal. In this connection, when the gate line 210 is additionally disposed between the substrate 101 and the first electrode 220 as shown in the example of FIG. 5, the current may be uniformly supplied to and throughout the light-emission area. The gate line 210 may be made of a metal material having a lower resistance than the transparent conductive oxide.

However, when the current is concentrated on the region near the gate line 210, the luminance uniformity may be lowered. Thus, the passivation film 230 may be disposed on a top face of the first electrode 220 in the non-light-emission region so as to cover the gate line 210. In one example, the passivation film 230 may be disposed on a top face of the gate line 210 and may be additionally disposed in a region where insulation, for example, between a second pad and the first electrode is required. The gate line 210 may be made of a metal material. The first electrode 220 may be made of a transparent conductive oxide material.

Further, referring to FIG. 6 and FIG. 7, the first electrode 220 includes a current injection line 225 in the non-light-emission area NLA. The current injection line 225 in the non-light-emission area NLA corresponding to a portion of the first electrode has a resistance higher than that of the first electrode in the light-emission area LA. The current injection line 225 serves to increase a barrier to inhibit the current from being injected into the light-emission area LA using the high resistance thereof. The presence of this current injection line may allow a short-circuit short between the first electrode and the second electrode in one light-emission area to have little effect on other light-emission areas. If there is no current injection line in the light-emission area, all of the light-emission areas may not work when a first electrode and a second electrode are short-circuited in one light-emission area. In this sense, the current injection line may be referred to as SR (short reduction) line.

Around the current injection line 225, a first insulating line 235a and a second insulating line 235b may be disposed. In the manufacturing process, the first electrode 220 is disposed on the entire surface of the substrate, and then a line is formed by etching the first electrode. When the etched away portion is filled with an insulating material, the first and second insulating lines 235a and 235b may be formed. The first and second insulating lines 235a and 235b may be portions of the passivation film 230.

In this connection, the etching of the first electrode 220 to form the first and second insulating lines 235a and 235b may be performed concurrently with the etching ((c) in FIG. 4) to form the hole in the first electrode in the bezel region. As a result of the etching of the first electrode 220 to form the first and second insulating lines 235a and 235b, the substrate 101 is exposed as in the example shown in FIG. 7. On the other hand, the gate line 210 is exposed as a result of etching to form the hole in the first electrode in the bezel region.

The first insulating line 235a disposed along an outer periphery of the light-emission area is intended to prevent current from being injected into other portions of the first electrode than the current injection line. The first insulating line 235a surrounds the light-emission area, but has an open structure rather than a closed structure so that the current may be injected into the light-emission area. That is, there is a gap between ends of the first insulating line 235a. Thus, current is injected into the light-emission area through this gap.

The second insulating line 235b is disposed alongside a portion of the first insulating line 235a. More specifically, the second insulating line 235b extends from one end of the first insulating line 235a, and extends alongside a portion of the first insulating line 235a. A length of the current injection line is determined by a length of the second insulating line 235b. Accordingly, the resistance of the current injection line may be determined.

Figure 8A:
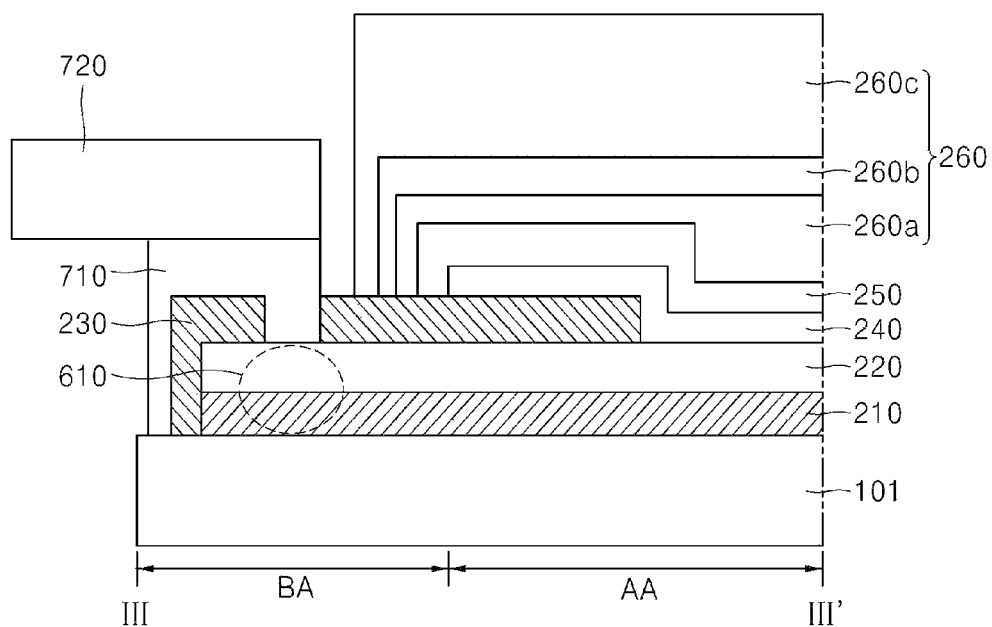
FIG. 8A shows a cross-sectional view along line in FIG. 6.
Figure 8B:
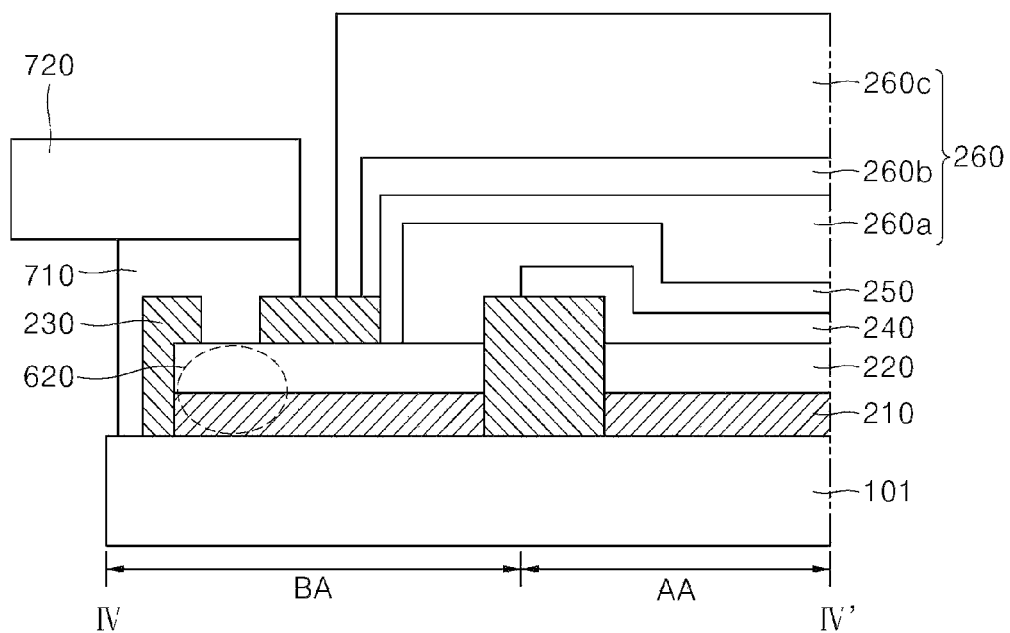
FIG. 8B shows a cross-sectional view along line IV-IV' in FIG. 6.

FIG. 8A shows a cross-sectional view along line III-III' of FIG. 6. FIG. 8B shows a cross-sectional view along line IV-IV' of FIG. 6. FIG. 8A and FIG. 8B show an example of each of pad areas 120a and 120b of FIG. 6. In FIG. 8A and FIG. 8B, the first and second insulating lines 235a and 235b shown in FIG. 6 and FIG. 7 are omitted.

Referring to FIGS. 6, 8A and 8B, each of the pad areas 120a and 120b including a first pad 610 connected to the first electrode 220 and a second pad 620 connected to the second electrode 250 may be present in a portion of the bezel region BA of the substrate 101.

Each of the first pad 610 and second pad 620 may be connected to a printed circuit board 720. A conductive film or a conductive adhesive 710 such as an ACF (anisotropic conductive film) may be used to connect the first pad 610 and the second pad 620 to the printed circuit board 720.

In an region other than the pad area 120 in the bezel region BA, the gate line 210, the first electrode 220 and the passivation film 230 are stacked on the substrate 101. As described above, in a region other than the pad area in the bezel region, the passivation film 230 is in contact with both the gate line 210 and the first electrode 220.

Specifically, in the region other than the pad area in the bezel region BA, the first electrode 220 may have a plurality of holes for exposing the underlying gate line 210. The passivation film 230 may be in direct contact with the gate line 210 through the plurality of holes formed in the first electrode 220. Further, in the region other than the pad area in the bezel region BA, the area of the passivation film 230 contacting the top surface of the gate line 210 may be wider than the area of the passivation film 230 contacting the top surface of the first electrode 220.

Referring to FIG. 8A, in each of the pad areas 120a and 120b, a portion of the first electrode 220 exposed upwardly may act as the first pad 610. Further, referring to FIG. 8B, the second pad 620 may be the portion of the first electrode 220 as exposed upwardly in each of the pad areas 120a and 120b. That is, the first pad 610 and the second pad 620 may be arranged in the same layer as the first electrode 220 in the array region, or may be arranged in the same layer as the gate line 210 and the first electrode 220 in the array region. However, the second pad 620 may be insulated from the first electrode 220 via the passivation film 230, and may be connected to the second electrode 250.

In an alternative, each of the first pad and the second pad may have a multi-layer structure. In this connection, each of the first pad and the second pad may include a first layer disposed in the same layer as the gate line 210 and a second layer disposed in the same layer as the first electrode 220.

The first pad and the second pad are connected to the printed circuit board 720. A conductive film or a conductive adhesive 710 such as an ACF (anisotropic conductive film) may be used to connect the printed circuit board 720 to the first pad and the second pad.

In one example. Referring to FIG. 8A and FIG. 8B, an encapsulating layer 260 is additionally formed on the second electrode. The encapsulating layer 260 may be made of a material having excellent moisture and air permeation prevention properties such as an inorganic material or a metal. The encapsulating layer 260 shown in FIGS. 8A and 8B has a structure in which an organic or inorganic buffer layer 260a, an inorganic layer 260b, and a metal layer 260c are sequentially stacked. However, the encapsulating layer is not limited to this three-layer structure. The encapsulating layer may have a single-layer structure, a two-layer structure, or a stack of four or more layers. Further, when the metal film is embodied as the metal layer 260c, an adhesive layer may be disposed between the inorganic layer 260b and the metal layer 260c. Further, at least one of the plurality of layers may act as a planarization layer. FIG. 8A and FIG. 8B show that the organic or inorganic buffer layer 260a acts as a planarization layer.

As described above, the organic-based lighting device according to the present disclosure has an advantage that the passivation film is in contact with both the gate line and the first electrode in the bezel region, thereby to reduce the peeling-off of the passivation film in the bezel region via a high bonding force therebetween.

The present disclosure has been described with reference to the drawings. However, the present disclosure is not limited by the aspects and drawings as disclosed herein. It will be apparent that various modifications may be made by those skilled in the art within the scope of the present disclosure. Furthermore, although the effects resulting from the configurations of the present disclosure have not been explicitly in describing the effect resulting from the configurations of the present disclosure, the effects expected from the configurations of the present disclosure should be recognized.

What is claimed is:

1. An organic light emitting device, comprising:
   an array region including a light-emission area and a non-light-emission area; and
   a bezel region outside the array region,
   wherein the array region has a structure where a gate line, a first electrode, a passivation film, an organic light-emission layer, and a second electrode are disposed on a substrate, and
   wherein the bezel region has a structure where the gate line, the first electrode and the passivation film are stacked on the substrate, and the passivation film contacts both the gate line and the first electrode.

2. The organic light emitting device of claim 1, wherein the gate line is made of a metal material, and
   wherein the first electrode is made of a transparent conductive oxide material.

3. The organic light emitting device of claim 1, wherein, in the bezel region, the first electrode has a plurality of holes exposing an underlying gate line, and
   wherein the passivation film contacts the gate line through the plurality of holes formed in the first electrode.

4. The organic light emitting device of claim 1, wherein, in the bezel region, a contact area between the passivation film and a top surface of the gate line is larger than a contact area between the passivation film and a top surface of the first electrode.

5. The organic light emitting device of claim 1, wherein, in the light-emitting area of the array region, the first electrode, the organic light-emitting layer and the second electrode are stacked, and
   wherein, in the non-light-emission area of the array region, the gate line, the first electrode, the organic light-emission layer, and the second electrode are stacked.

6. An organic light emitting device comprising:
   an array region including a light-emission area and a non-light-emission area, wherein the array region has a structure where a gate line, a first electrode, a passivation film, an organic light-emission layer, and a second electrode are disposed on a substrate; and
   a bezel region outside the array region, wherein the bezel region has a pad area and non-pad area disposed on the substrate,
   wherein the pad area includes a first pad connected to the first electrode and a second pad connected to the second electrode, and
   wherein the non-pad area has a structure where the gate line, the first electrode, and the passivation film are stacked on the substrate, and the passivation film contacts both the gate line and the first electrode.

7. The organic light emitting device of claim 6, wherein the gate line is made of a metal material, and
   wherein the first electrode is made of a transparent conductive oxide material.

8. The organic light emitting device of claim 6, wherein the non-pad area in the bezel region has a structure where the first electrode has a plurality of holes exposing the underlying gate line, and the passivation film contacts the gate line through the plurality of holes formed in the first electrode.

9. The organic light emitting device of claim 6, wherein the non-pad area in the bezel region has a structure where a contact area between the passivation film and a top surface of the gate line is larger than a contact area between the passivation film and a top surface of the first electrode.

10. The organic light emitting device of claim 6, wherein the pad area includes first and second pads that each includes a first layer arranged in a same layer as the gate line and a second layer arranged in a same layer as the first electrode.

11. The organic light emitting device of claim 10, wherein the second layer has a plurality of holes exposing an underlying first layer.

12. The organic light emitting device of claim 6, wherein the light-emitting area has a structure where the first electrode, the organic light-emitting layer and the second electrode are stacked, and
   wherein the non-light-emission area has a structure where the gate line, the first electrode, the organic light-emission layer, and the second electrode are stacked.

13. An organic light emitting device comprising:
   an array region including a light-emission area and a non-light-emission area, wherein the array region has a structure where a gate line, a first electrode, a passivation film, an organic light-emission layer, and a second electrode are disposed on a substrate; and
   a bezel region surrounding the array region and including a pad area and non-pad area disposed on the substrate, wherein the pad area includes a first pad connected to the first electrode and a second pad connected to the second electrode, and the non-pad area has a structure where the gate line, the first electrode and the passivation film are sequentially stacked on the substrate,
   wherein the gate line and the first electrode are respectively formed of a metallic material and a transparent conductive oxide material, and the passivation film contacts both the gate line and the first electrode.

14. The organic light emitting device of claim 13, wherein the non-pad area in the bezel region has a structure where the first electrode has a plurality of holes exposing the underlying gate line, and the passivation film contacts the gate line through the plurality of holes formed in the first electrode.

15. The organic light emitting device of claim 13, wherein the non-pad area in the bezel region has a structure where a contact area between the passivation film and a top surface of the gate line is larger than a contact area between the passivation film and a top surface of the first electrode.

16. The organic light emitting device of claim 13, wherein the pad area includes first and second pads that each includes a first layer arranged in a same layer as the gate line and a second layer arranged in a same layer as the first electrode.

17. The organic light emitting device of claim 16, wherein the second layer has a plurality of holes exposing an underlying first layer.

18. The organic light emitting device of claim 13, wherein the light-emitting area has a structure where the first electrode, the organic light-emitting layer and the second electrode are stacked, and wherein the non-light-emission area has a structure where the gate line, the first electrode, the organic light-emission layer, and the second electrode are stacked.

* * * * *